United States Patent [19]

Okazawa et al.

[11] Patent Number: 5,295,107
[45] Date of Patent: Mar. 15, 1994

[54] METHOD OF ERASING DATA STORED IN FLASH TYPE NONVOLATILE MEMORY CELL

[75] Inventors: Takeshi Okazawa; Ken-Ichi Oyama; Hiroki Shirai, all of Tokyo, Japan

[73] Assignee: NEC Corporation, Tokyo, Japan

[21] Appl. No.: 24,074

[22] Filed: Mar. 1, 1993

[30] Foreign Application Priority Data

Mar. 2, 1992 [JP] Japan .................. 4-044708

[51] Int. Cl.$^5$ .............................................. G11C 7/00
[52] U.S. Cl. .................. 365/218; 365/185; 365/900
[58] Field of Search ............... 365/185, 218, 900, 104

[56] References Cited

U.S. PATENT DOCUMENTS

| | | | |
|---|---|---|---|
| 4,742,491 | 5/1988 | Liang et al. | 365/218 |
| 4,884,239 | 11/1989 | Ono et al. | 365/185 |
| 5,122,985 | 6/1992 | Santin | 365/185 |

OTHER PUBLICATIONS

"An In-System Reprogrammable 32K X 8 CMOS Flash Memory", Virgil Niles Kynett et al., IEEE Journal of Sold-State Circuits, vol. 23, No. 5, Oct. 1988, pp. 1157-1163.

"A Self-Convergence Erasing Scheme For A Simple Stacked Gate Flash Eeprom", Seiji Yamada et al., IEEE IEDM 91-307, 1991; pp. 11.4.1-11.4.4.

Primary Examiner—Eugene R. LaRoche
Assistant Examiner—Son Mai
Attorney, Agent, or Firm—Sughrue, Mion, Zinn, Macpeak & Seas

[57] ABSTRACT

A method of controlling the nonvolatile memory device comprising making over-erasing simultaneously a set of EEPROM elements and then setting simultaneously the threshold voltages of said set of EEPROM elements back to the specified threshold-voltage values. The over-erasing is accomplished by applying a first pulse between the source and the control gate to induce the first FN current across the gate insulating film. The setting-back is accomplished by applying a second pulse between the well and the control gate to induce the second FN current flowing reversely to the first FN current.

15 Claims, 6 Drawing Sheets

METHOD OF ERASING DATA STORED IN FLASH TYPE NONVOLATILE MEMORY CELL

BACKGROUND OF THE INVENTION

1. Field of the Invention

This invention relates to a method of controlling nonvolatile memory device, and more particularly to a method of electrically erasing data stored in nonvolatile memory elements or cells simultaneously with one another.

2. Description of the Prior Art

Flash memory, which is one of electrically rewrittenable nonvolatile memory devices (EEPROMs) permitting a set of memory elements thereof to be simultaneously electrically-erased, is disclosed in an article entitled "An in-system reprogrammable CMOS flash memory" Virgir Niles Kynett, etc., IEEE Journal of Solid-state Circuits, Vol. 23, No. 5, October 1988, pp. 1157–1163.

Figure 1:
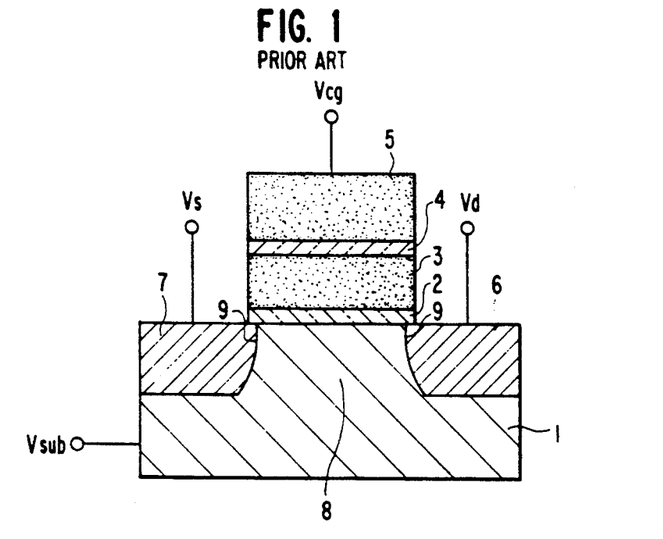
FIG. 1 is a cross-sectional view of an EEPROM element.

Similarly to EEPROM elements erasable individually, memory elements or memory cells of this flash memory device have a stacked-gate structure as shown in FIG. 1:

Formed in a p-type silicon substrate 1 are an n-type source region 7 and an n-type drain region 6. A first oxide insulating film 2 of about 10 nm in thick is formed over the channel region 8 between regions 6 and 7 to overlap slightly regions 6, 7 at their edges 9. On the first gate insulating film 2 floating gate electrode 3 of polycrystalline silicon 3 and a second gate insulating film 4 of 25 nm in thick are formed in that order. Further on this top surface a control gate electrode 5 is formed. The prior art memory cell of this type will be briefly set forth below.

Writing or storing data in memory cells is carried out by applying a voltage such as +7 V (drain voltage Vd) to drain region 6 while semiconductor substrate 1 and source region 7 are being connected to the ground potential ($V_{sub}=V_s=0$ V). Further application of voltage such as +12 V ($V_{cg}$) is carried out to control gate electrode 5. Floating gate electrode 3 is completely electrically-isolated, and hence its potential is determined as one value by the ratio between the source/drain-floating gate capacitance and control gate-floating gate capacitance, together with by the potentials of control gate electrode, source/drain regions and semiconductor substrate. Usually if the potential of the floating gate is set to much the same as the drain potential, the maximum amount of hot electrons (those having energy overcome the barrier of the first gate insulating film) from current flowing between the source and drain regions, which are injected into the floating gate electrode, is available. Many times. The above-mentioned potentials are set. Under these conditions, electrons are injected into the floating gate and its potential is forced to drop to a negative level. Consequently the threshold voltage of the memory cell, or that with respect to control gate electrode, shifts in the positive direction to about +7 V set commonly.

Conversely, for erasing the data of the memory cell the above-mentioned injected electrons are forced to flow out of the floating gate. This is accomplished, for example, by connect the substrate and the control gate to the ground potential ($V_{cg}/V_{sub}=0$ V), and applying +12 V ($V_s$) to the source in open state of drain region 6.

The potential of floating gate 3 depends on the potentials of the regions, as described above, and itself is at a negative potential when written. As the result that this negative potential adds, a fairly large electric field (1.0 MV/cm or more at those potentials) is applied to the first gate insulating film 2 between source region and floating gate 3, and as well-known, causes the quantum-mechanical Fowler-Nordheim tunneling current (referred to as FN current hereinafter) to flow across the first gate insulating film, as well-known. The memory cell can be erased by making use of this effect to flow of electrons from floating gate 3 to source region 7.

As stated above, "written" is defined as "state of the memory cell with its threshold voltage shifted in positive direction by injecting electrons into the floating gate" and "erased" as "that with its threshold voltage shifted in negative direction by removing electrons from the floating gate". These are not always considered as limiting but others by which two different states of the memory cell are represented may be of course used.

Writing and erasing of the memory cell are performed in such a way. For flash memory, writing is carried out by the above-mentioned method while it is possible to erase collectively a memory cell array consisting of a certain number of memory cells arranged in matrix by applying voltage $V_s$ simultaneously to all the source regions after connecting them to a common terminal. This enables to erase a large capacity memory in a shorten time.

There was however a problem for the conventional flash memory as described above that collectively erasing a memory cell array results in a too-wide-dispersed threshold voltages of the memory cells.

This is because that in the case of erasing simultaneously a plurality of memories the amount of electrons tunneling from floating gate electrode 3 to source region 7 or the FN current, which can be determined by various physical conditions: applied voltage, the thickness of the first gate insulating film 2, the area of floating gate 3 overlapping source region 7. These varies inevitably from memory cell to memory cell depending on fabrication process. This reflects the inevitably-varying FN current values, and correspondingly the amounts of electrons removed from floating gate 3 to source region 7 differ among memory cells with deviations of the extent of going beyond its permissible range.

Figure 2:
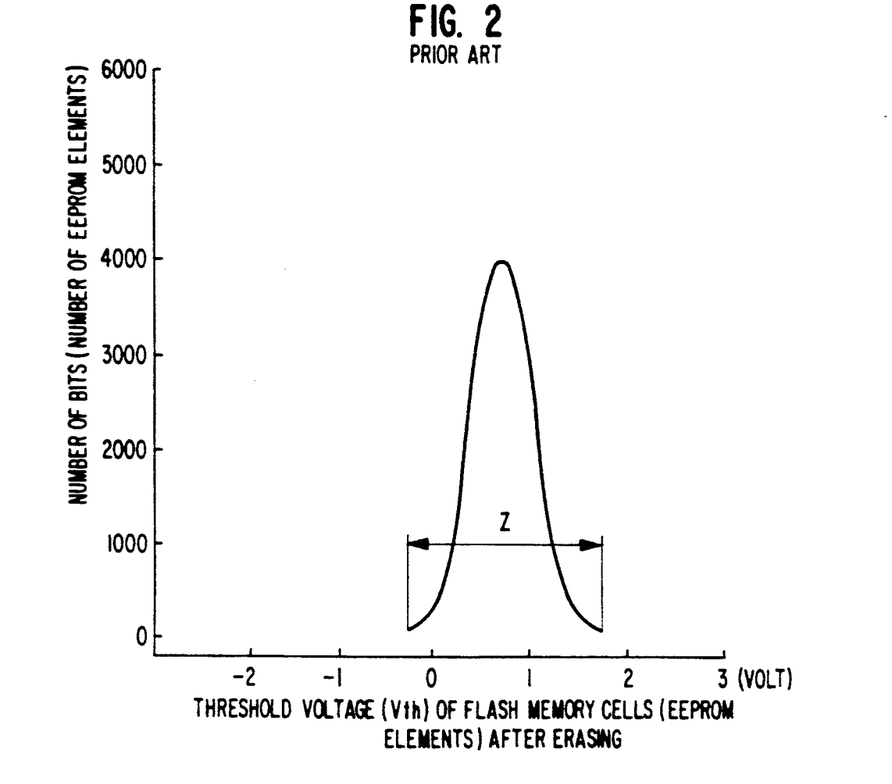
FIG. 2 is a graph showing the distribution of the erased-state threshold voltages for the flash memory in a prior art.

FIG. 2 is a graph showing the distribution of the threshold voltages $V_{th}$ of a flash memory, which plots the results of measuring them after erasing. The graph shows a substantially normal distribution of which the width "Z" between the upper and lower limit values is about 2 V. In other words, erasing simultaneously all EEPROM memory cells of a memory array having some memory capacity such as 256 kbits (32 kbytes) results in a difference of about 2 V in threshold voltage $V_{th}$ between the earliest- and the latest-erased memory cells, and the distribution extends below 0 V. For erasing collectively the memory cell array of the flash memory device as mentioned above therefore it is necessary to interrupt the entire erasing operation before the threshold voltage of the memory cell which is being earliest erased goes down beyond 0 V because, as well known, for any memory cell connected to a bit line, drop of the threshold voltage to below-zero voltages could make it impossible to raise the potential of the bit line, with a result that both writing into and reading from all the memory cells become impossible.

If the entire erasing operation was interrupted before going down below 0 V, the latest-erased memory cell, as considered from the aforesaid distribution, inevitably would become higher than 2 V in threshold voltage. Practically it is common to set the erased-state threshold voltages of the memory cells to about 2.5 to about 3 V, estimating 0.5 to 1 V as room of threshold voltage of the earliest-erased memory cell. This makes it impossible to set the potential of the word line to any below the threshold voltage of the latest-erased memory cell, which means that in the prior art the write/readout voltages can not used if they are below 2.5 to 3.5 V. It however follows that flash memories only can not cope with application-voltage lowering in the technological fashion of lowering application voltages. For the purpose of overcoming this, effort have been devoted to reducing dispersion of erased-state threshold voltages of the memory cells by the use of various methods.

For reducing the unwantedly-wide dispersion of threshold voltages to a desired value it is needed to minimize variation in the above-mentioned physical parameters among memory elements but difficult because of obstacles to improvement of fabrication process.

In this circumference has been proposed a method for reducing dispersion of threshold voltage with an electronic procedure following collective erasing in an article entitled "A self-convergence erasing scheme for a simple stacked gate flash EEPROM" Seiji Yamada, IEDM, etc. 91, pp. 307-310, which will be described with reference to FIG. 3 and also to FIG. 1 as needed.

Figure 3:
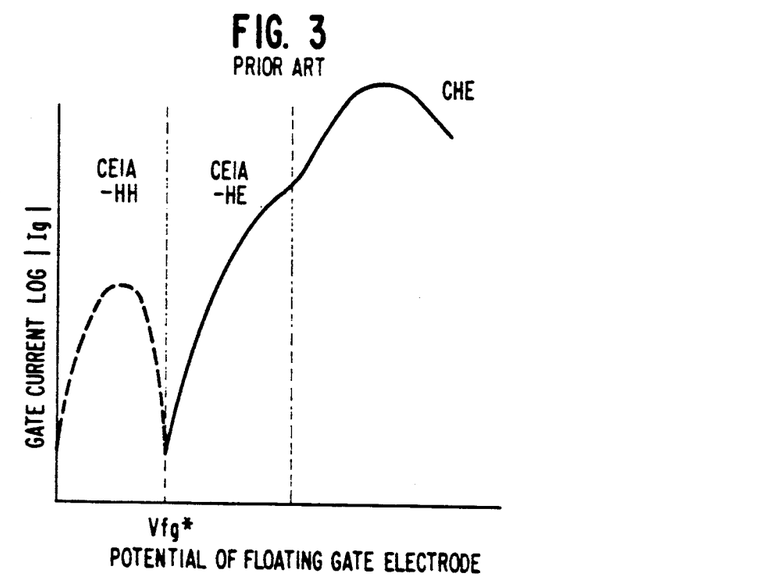
FIG. 3 is a graph for illustrating the prior art method for the flash memory for reducing the dispersion of the erased-state threshold voltages.

FIG. 3 shows dependence of gate current (Ig: current of flowing into or out of the floating gate) on positive floating-gate potential. When the source-drain voltage is greater than the floating gate potential, i.e. $V_{sd} > V_{fg}$, hot carriers of the source-drain current are injected into floating gate 3 (generation of gate current). Then whether carriers injected are electrons or holes depends on the potential of floating gate 3. In FIG. 3 are seen three sections, in sequence of rising potential of floating gate 3 $V_{fg}$, of channel electron-induced avalanche hot hole (CEIA-HH), channel electron-induced avalanche hot electron (CEIA-HE) injection, channel hot electron (CHE) injection. The potential represented by $V_{fg}^*$ is a transition point at which no hot carrier injection occurs and CEIA-HHs and CEIA-HEs is in balance.

For example, under the conditions meeting $V_{fg} > V_{fg}^*$ and $V_{ds} > V_{fg}$, CEIA-HE injection into the floating gate 3 occurs, which lowers its potential, which in turn decreasing CEIA-HE injection. Thus, the potential eventually converges at $V_{fg}^*$.

Figure 4:
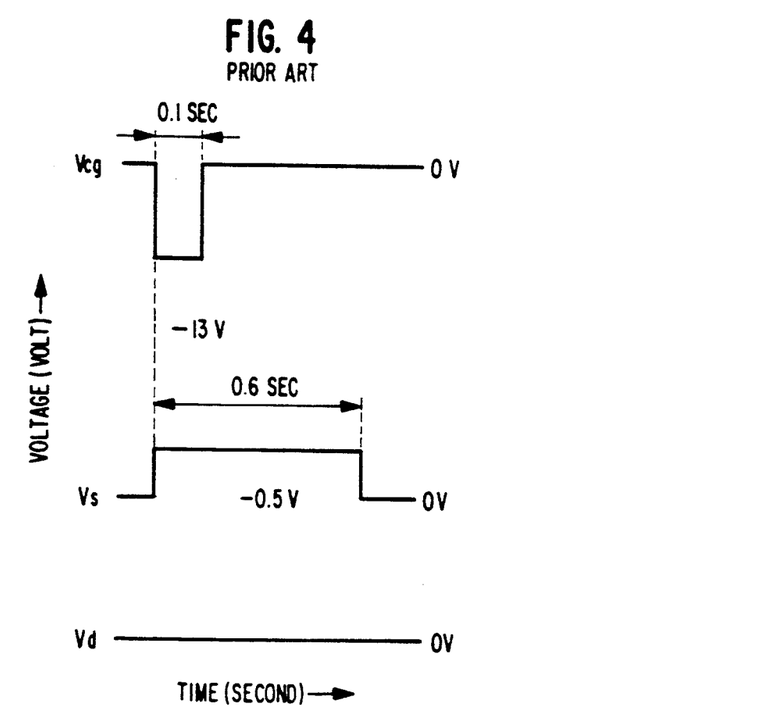
FIG. 4 is a timing diagram of the voltages applied to the electrodes according to the prior art method.

An example in the prior art will be described with reference to FIG. 4 showing a timing diagram of the voltages of the electrodes during data erasing. With a drain voltage ($V_d$) of 0 V, application of a control-gate voltage pulse ($V_{cg}$) of $-13$ V and 0.1 sec, and a source voltage pulse ($V_s$) of $+0.5$ V and 0.6 sec induces FN current and consequently electrons escape floating gate 3 during the first 0.1 sec, eventually its potential converges, and in turn the erased-state threshold voltage with respect to the control gate converges at a certain value. This contributes to reducing dispersion.

However, the above-mentioned data-erasing method for nonvolatile memory device utilizes avalanche phenomenon as means for reducing dispersion of the erased-state threshold voltages. This presents the problem of allowing the hot carrier injection associated with avalanche phenomena to damage the source and drain regions, resulting in lowered breakdown voltage of the junctions between these regions and the semiconductor substrate. The avalanche phenomenon further causes hot carrier injection into the overlapped area of the drain region and the gate insulating film, too, resulting in degradation of the gate insulating film.

In addition, this process of reducing the dispersion of the erased-state threshold voltages consumes large power needing for the hot electron injection current into the floating gate and additionally source-drain current for generation of avalanche phenomenon.

SUMMARY OF THE INVENTION

It is therefore the primary object of the present invention to provide a method for simultaneously erasing a set of memory elements with reduced dispersion of their erased-state threshold voltages as well as minimized power consumption and without doing damage to the source and drain regions and the gate insulating film.

According to the present invention, there is provided a method for simultaneously erasing contents of a set of memory elements each having a well of one conductivity type in a semiconductor substrate, source and drain regions of the opposite conductivity type in the well, channel region of the one conductivity type between the source and drain regions, a first gate insulating film formed on the channel region and overlapping the source and drain regions, a floating gate electrode formed on the first gate insulating film, a second gate insulating film formed on the floating gate electrode, and a control gate electrode formed on the second gate insulating film, which method comprises the steps of applying a first pulse between the source and the control gate so that the first FN current across the first gate insulating film occurs so as to over-erase the set of memory elements, with the center value of the threshold-voltage distribution of the set of memory elements moved beyond a specified threshold-voltage value; and then applying an appropriate second pulse between the well and the control gate for inducing a second Fowler-Nordheim tunneling current across the first gate insulating film reversely flowing to the first FN current so as to set the center value of the threshold-voltage distribution of the set of memory elements to the specified threshold-voltage value.

The further feature of the present invention resides in a method for controlling a nonvolatile memory device by electrically erasing simultaneously the contents of a set of memory elements with the threshold voltages thereof moved to the specified threshold-voltage values, each memory element consisting of a p-well in a semiconductor substrate, n-type source and drain regions in the p-well, a channel region between the source and drain regions in the p-well, a first gate insulating film formed on the channel region and overlapping the source and drain regions, a floating gate electrode formed on the first gate insulating film, a second gate insulating film formed on the floating gate electrode, and a control gate electrode formed on the second gate insulating film, compressing: the first step of applying a pulse to the control gate, the voltage of the pulse being negative with respect to the voltage applied to the source, whereby under the Fowler-Nordheim tunneling effect, electrons flows from the floating gate across the first gate insulating film to the source region, and the second step of applying a pulse to the control gate, the voltage of the pulse being positive with respect to the voltage applied to the p-well, whereby under the Fowler-Nordheim tunneling effect, electrons being injected from the channel region back to the floating gate.

BRIEF DESCRIPTION OF THE DRAWINGS

The above-mentioned and other objects, features and advantages of this invention will become more apparent by reference to the following detailed description thereof (of the invention taken in conjunction with the accompanying drawings, wherein.

DETAILED DESCRIPTION OF THE PREFERRED EMBODIMENTS

Figure 5:
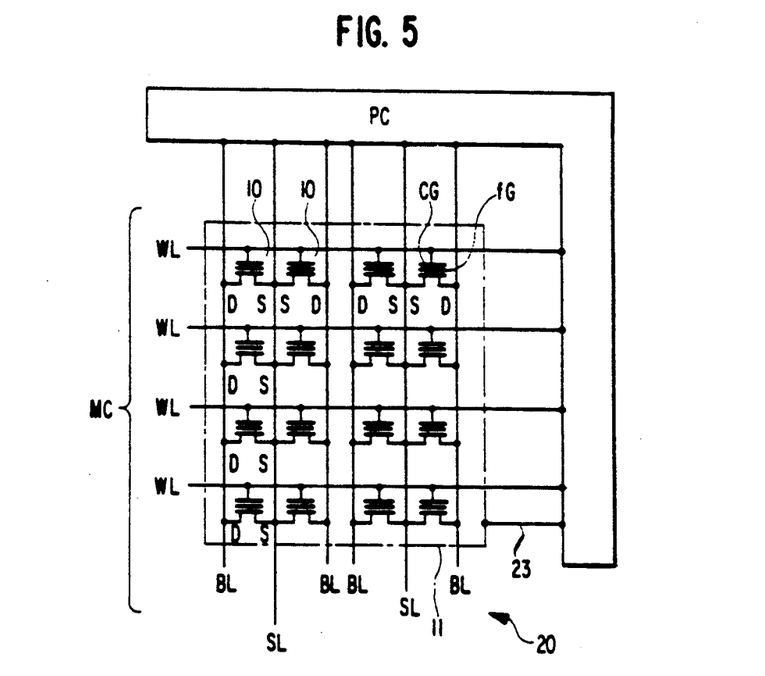
FIG. 5 is a circuit diagram of the memory array of a nonvolatile memory device for illustrating an embodiment of the present invention.

The present invention will be described with reference to the accompanying drawings:

A nonvolatile memory device used in an embodiment of the present invention comprises on a single silicon crystal a memory circuit part MC and its peripheral circuit PC including row and column decoders. In the memory circuit part MC is formed a p-well 11 in which a matrix of one-bit memory cells each consisting of an EEPROM element 10 is contained. Sources S of EEPROMs 10 are connected through source lines SL to peripheral circuit PC, drains D through the bit lines BL to the column decoder, and control gate electrodes CG through word lines WL to the row decoder, p-well region 11 is connected through lines 23 to peripheral circuit PC.

Figure 6:
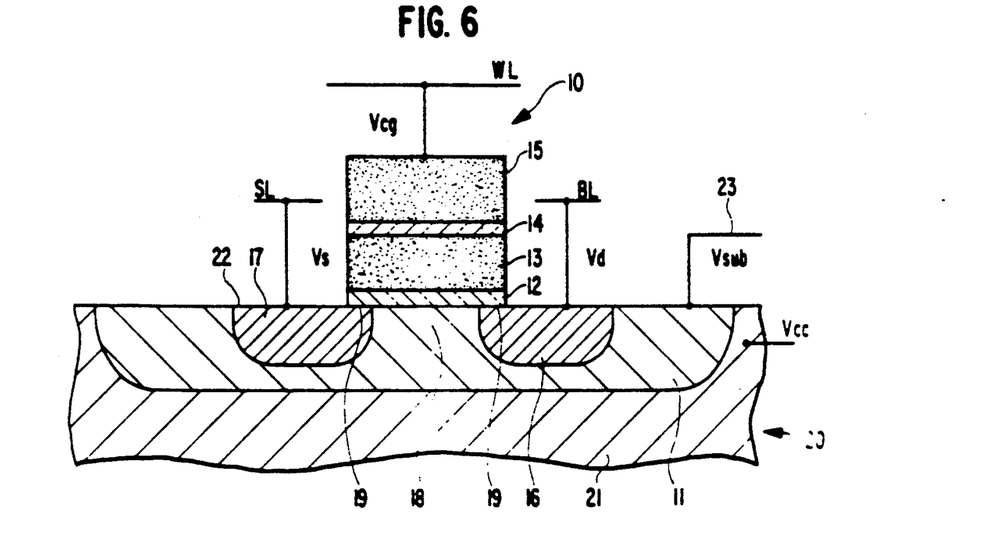
FIG. 6 is a cross-sectional view of an EEPROM element or memory cell of FIG. 5.

FIG. 6 gives a sectional view of an EEPROM element 10. In a single-crystal substrate 20 is formed a n-well region 21, and a p-wells 11 is formed to be surrounded by n-well region 21. A voltage of $+5$ V ($V_{cc}$) is applied to n-well region 21, and hence the pn junctions between both wells are reverse-biased. n-type source region 17 and n-type drain region 16 are formed at the surface of substrate 20 and in p-well region 11. There is a channel region 18 between source and drain regions 16, 17. On the surface of substrate 20, the first gate insulating film 12 of 8 to 11 nm thick is formed and its both edges overlap the edges of the source and drain regions. A floating gate electrode 13 made from polycrystalline silicon is on the first gate insulating film 12, and on this top surface, the second insulating film 14 which is a 15–30 nm-thick composite film made of silicon oxide film, silicon nitride film and silicon oxide film. On this top, a control gate electrode made from polycrystalline silicon 15 is formed. Thus a stacked gate structure is fabricated. Source voltage $V_s$ is applied to source 17 from source line SL, drain voltage $V_d$ to drain 16 from bit line BL, and gate voltage $V_{cg}$ to control gate 15 from word line WL. Well voltage, which is substrate voltage $V_{sub}$ with reference to EEPROM element, is applied to p-well region 11.

For the flash memory to which the present invention is to be applied, a set of 4096 or more EEPROM elements (memory cells) corresponding to 512 or more bytes can be simultaneously erased. For example, a set of memory cells corresponding to 32 kbytes (256 kbits) can be simultaneously erased by applying the same $V_s$, $V_d$ and $V_{cg}$ each, to the needed numbers of source, bit and word lines SL, BL and WL, respectively.

Figure 7:
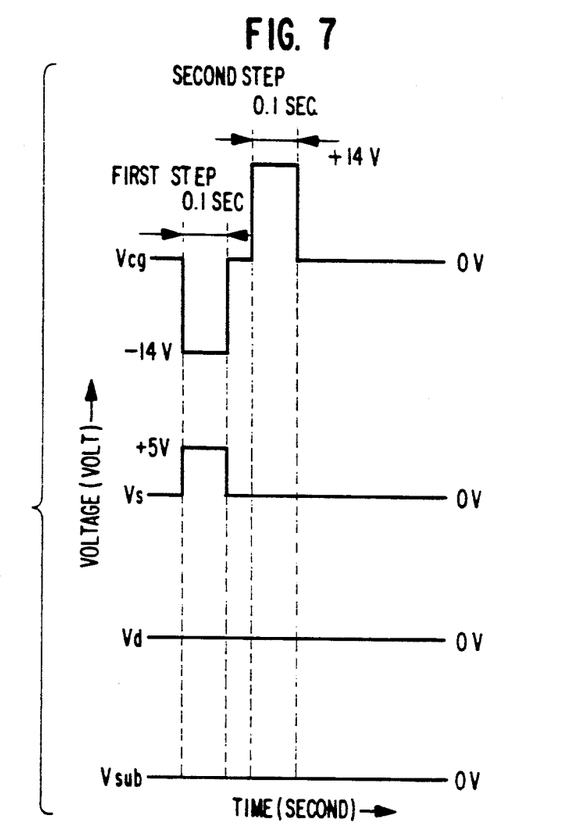
FIG. 7 is a timing diagram of voltage applied to the electrodes for the embodiment of the present invention.

In an embodiment, during erasing process the voltages are applied to the set of EEPROM elements according to the timing diagram of FIG. 7.

A set of EEPROM elements as of $+7$ V in written-state threshold voltage are simultaneously erased into a specified threshold voltage of 1.3 V which is determined by element parameters including length and width of channel, and circuit parameters.

The erasing method of the present invention consists of the first and second erasure steps:

In the first step, the terminals of drains 16 and p-wells 11 are connected to ground potential ($V_d=V_{sub}=0$ V). Under these conditions, a pulse ($V_{cg}=-14$ V, 0.1 sec) is applied to the terminal of control gates 15, and another pulse ($V_s=+5$ V, 0.1 sec) to the terminal of source 17. During the pulse duration, the potential of the control gate 15 maintains $-19$ V with respect to the potential of source 17. Under the Fowler-Nordheim tunneling effect, the first FN current occurs, that is, electrons flows across the first gate insulating film 12 from the floating gate 13 to the source region 17. Then over-erasing is made with the floating gate 13 charged with positive holes. Besides, the threshold-voltage distribution shifts accompanied by movement of its center value down, as to $+0.5$ V, beyond the specified point, such as $+1.3$ V, where it should goes when finally-erased. Some threshold voltages become negative. Further feature in the over-erased state of this embodiment resides in keeping temporarily the highest threshold voltage lower than the permissible highest threshold voltage in the finally-erased state.

In the second erasure step, while maintaining $V_d$, $V_{sub}$ and also $V_s$ at 0 V, a pulse ($+14$ V, 0.1 sec) is applied to control gate 15. During this pulse duration, therefore, the potential of the control gate 15 is maintained at $+14$ V with respect to the p-well 11. Under the Fowler-Nordheim tunneling effect, FN current across the first gate insulating film 12 occurs, and the threshold voltages are caused to shift so that the center value of the threshold distribution moves back to the specified erased-state threshold value 1.3 V. The second erasure step produces effect reducing the threshold-voltage dispersion of the EEPROM element set as compared with that after the first erasure step.

Figures 8A, 8B:
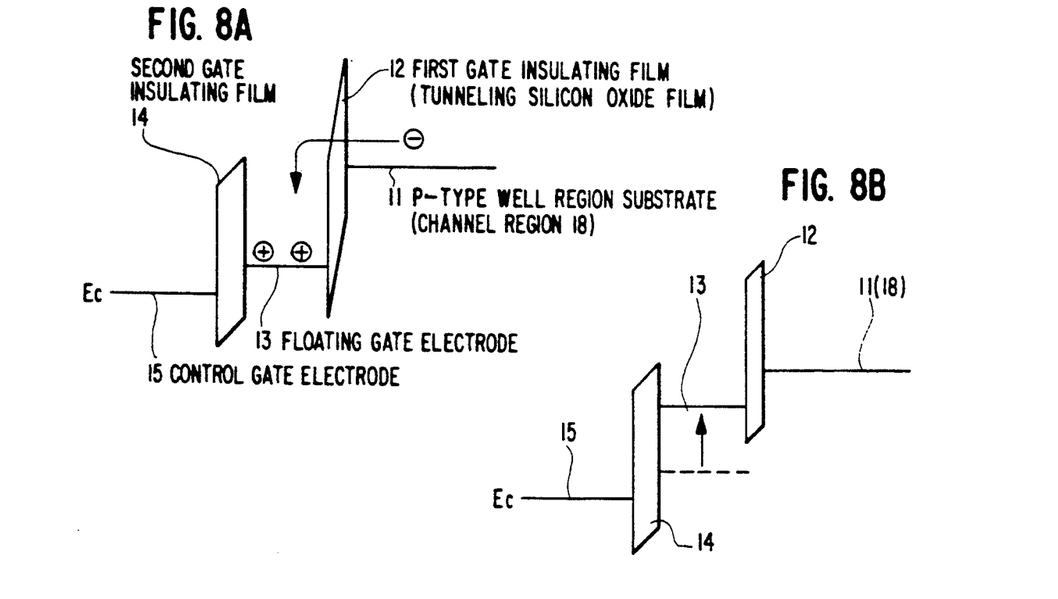
FIGS. 8A and 8B are energy band diagram for illustrating the principle of the present invention.

Referring to FIG. 8A and 8B showing energy band diagrams, the reason for this will be set forth. In the second erasure step, directly after application of a pulse ($+14$ V, 0.1 sec) to control gate 15, floating gate 13 is charged with positive holes as shown in FIG. 8A and hence the energy band of floating gate 13 deviates from the energy level determined by capacitive division of the voltage, 14 V, applied between control gate electrode 15 and channel region 18 (p-well 11).

Under these conditions occurs FN current of injecting electrons from channel region 18 across the first gate insulating film 12 to floating gate 13, which causes drop of the potential of the floating gate electrode, which in turn reduces FN current. Eventually the floating gate goes to a certain potential no electrons are injected into it, as shown in FIG. 8B, that is, a fixed threshold-voltage value with respect to the control gate 15 results, which effects reduction of the threshold-voltage dispersion.

Figure 9:
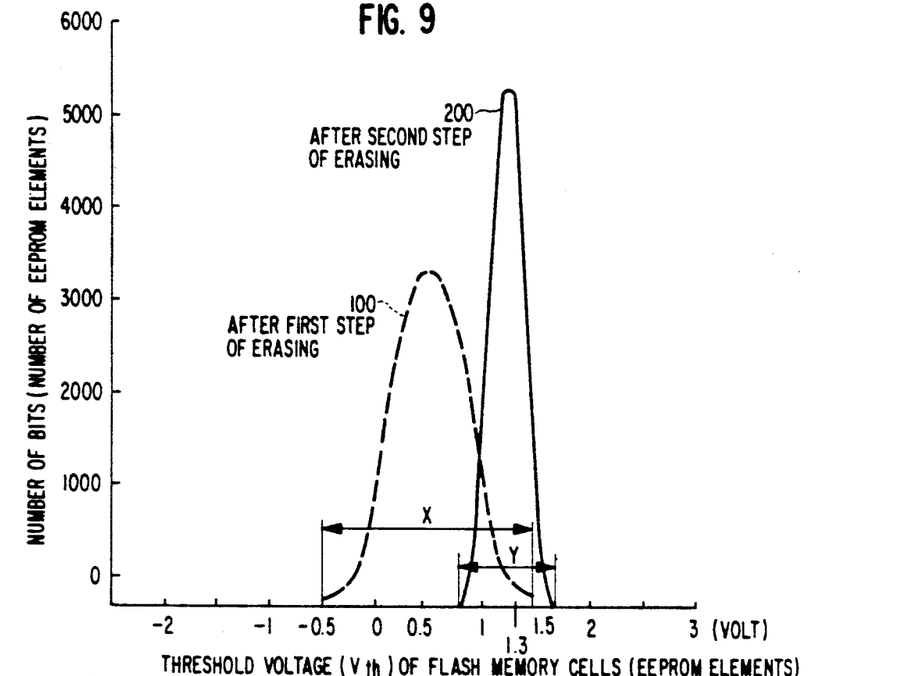
FIG. 9 is a graph showing the distribution of the erased-state threshold voltages in the embodiment of the present invention.

In FIG. 9 plotting the collective erasing results of this embodiment with a 256 kbit memory cell array including 256000 EEPROM elements, curve 100 shows the distribution after the first erasure step, which has a center threshold voltage of +0.5 V and a width (shown by "X") of 2 V±1 V. The threshold distribution after the second erasure step of applying a positive voltage pulse to inject electrons back into the floating gate, as curve 200 shows, becomes shifted to 1.3 V in center threshold voltage and narrowed to a width (shown by "Y") of 0.9±0.45 V.

Figure 10:
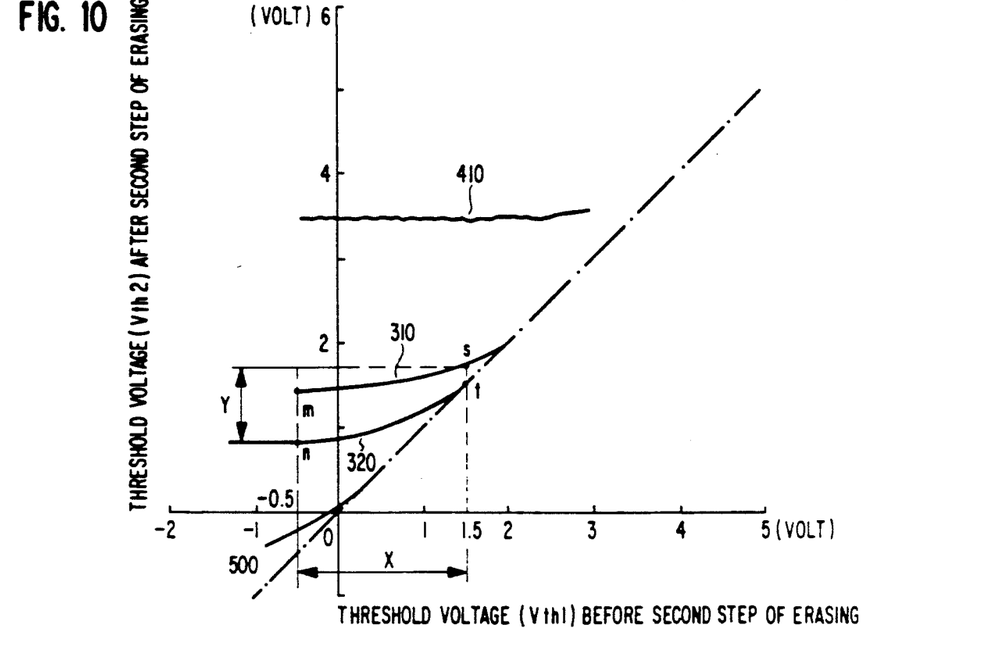
FIG. 10 shows the dispersion of threshold voltages by the second step in the embodiment of the present invention.

Reference to FIG. 10 is made in which abscissa and ordinate represent threshold voltage before and after the second erasure step ($V_{th1}$ and $V_{th2}$), respectively.

For the memory element set, curves 310 and 320 represent the upper and lower limits, respectively, of the corresponding threshold voltage ($V_{th2}$) range after the second erasure step of applying the pulse (+14 V, 0.1 sec), to the threshold voltage ($V_{th1}$) range of −0.5 to 1.5 V, hence width (indicated with X) 2 V, before the second erasure step as indicated by curve 100 in FIG. 9.

For example, the highest threshold voltage before the first erasure step moves, after the second erasure step, to somewhere between point "s" (+1.75 V) on the upper limit curve 310 and point "t" (+1.5 V) on the lower limit curve 320, both having an abscissa of +1.5 V. Likewise the lowest threshold voltage before the first erasure step moves, after the second erasure step, to somewhere between point "m" (+1.6 V) on the upper limit curve 310 and point "n" (+0.58 V) on the lower limit curve 320, both having an abscissa of −0.5 V. It follows that the threshold voltages ($V_{th2}$) after the second erasure step or the finally-erased-state threshold voltages of the flash memory are within a reduced range (indicated with Y) of +0.85 V to +1.75 V (width 0.9 V).

In the second step of this embodiment, a certain quantity of electrons in total is necessary to be injected back into the floating gate. Hence, instead of the pulse of +14 V and 0.1 sec, for example, a pulse of +12 V and 1 sec may be applied to the control gate to produce similar effect. Any pulse so high in voltage or long in duration that excess electrons are injected back into the floating gate results in to higher voltages as indicated by curve 400 than the specified threshold voltages, hence disadvantageous characteristics. The upper and lower limit curves associated with curve 400 exist but are not used at any rate because of obtaining undesirable threshold voltages. Similarly any pulse of so low voltage or short time that insufficient electrons are injected back into the floating gate results undesirably in forcing some memory cells to go to negative threshold voltages as indicated by curve 500.

It is desired for actual flash memories to inject electrons back into the floating gate in the second step with pulse of any optimum combination of an applied gate voltage $V_{cg}$ within the range of +12 V to +16 V with respect to the channel region, and duration of it between 0.01 sec and 1 sec, the combination being so selected that a specified threshold voltage determined by element parameters such as the length and width of the channel and circuit parameters can result.

Figure 11:
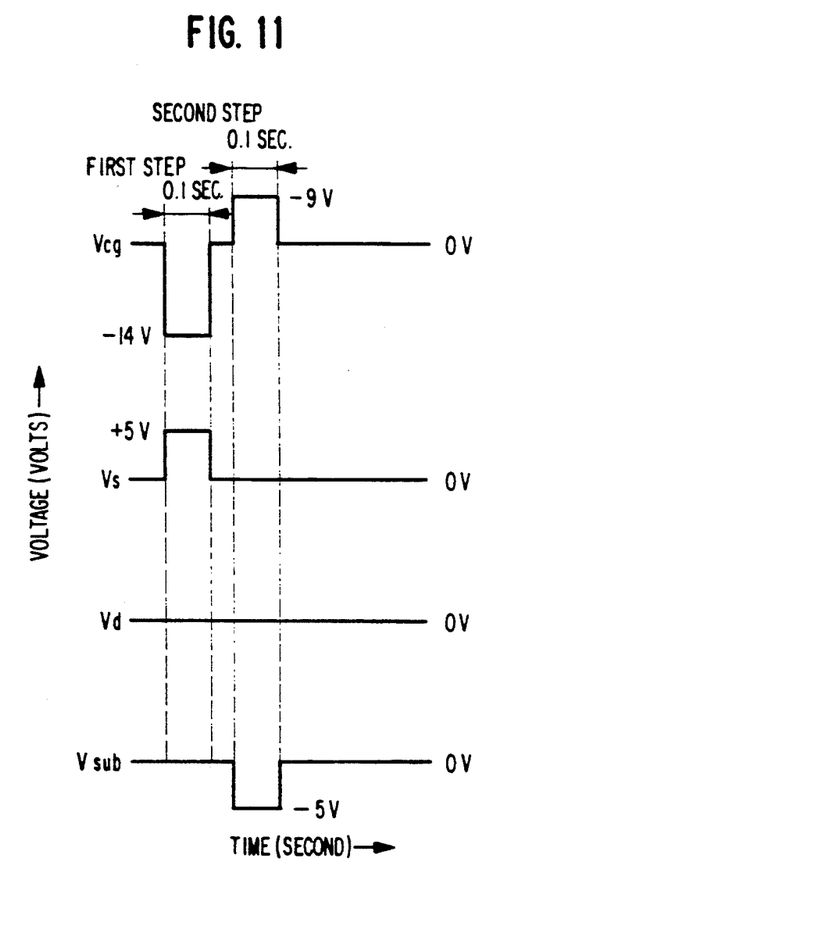
FIG. 11 is a timing diagram of voltage for the electrodes in an alternative method embodiment of the present invention.

FIG. 11 is a timing diagram of applying an alternative pulse ($V_{cg}$=+9 V, 0.1 sec) to control gate 15 in the second step following the same first step of FIG. 7. In the second step, a pulse ($V_{sub}$=−5 V, 0.1 sec) is applied to p-well 11 through line 23 from the surrounding circuit, with drain voltage $V_d$ and source voltage $V_s$ are connected to 0 V. In this case, during the pulse duration of 0.1 sec, control gate 15 maintains +14 V with respect to channel region 18, which causes the Fowler-Nordheim tunneling effect of injecting electrons back from channel region 18 into floating gate 13 across the first gate insulating film 12 to move back to the specified threshold voltage, with the same effect as in the above embodiment. The lower $V_{cg}$ possible with the negative voltage of $V_{sub}$ can contribute to realization of lower-voltage operable devices.

The embodiments with n-channel EEPROM elements have been described. With p-channel EEPROM elements, the similar is possible by replacing n-type with p-type and applying opposite-polarity pulses.

As described above, the feature of the present invention resides in making it possible for the flash memory that a set of memory cells or EEPROM elements is simultaneously over-erased by FN current under the Fowler-Nordheim tunneling effect, and then injection of electrons back into the floating gate similarly by FN current under the Fowler-Nordheim effect to shift back is carried out, resulting in the specified erased-state threshold voltage and a narrowed dispersion.

Finally, in the step of shifting back to the specified threshold voltage and reducing the dispersion, not hot carriers due to the avalanche phenomenon but FN current is used, therefore without disadvantages as of doing damage to source and drain regions and gate insulating film with the resulting lowering in junction breakdown voltage and increase in current leakage. FN current of electrons injected into the floating gate and nothing else is used and hence reduced consumption power is needed.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A method for electrically erasing contents of a plurality of memory cells to shift threshold voltages thereof to an erased threshold value, each of said memory cells including a substrate region of one conductivity type, source and drain regions of the opposite conductivity type formed in the substrate region, a first gate insulating film formed on a channel region of said substrate region between said source and drain regions, a floating gate electrode formed on said first gate insulating film, a second gate insulating film formed on said floating gate electrode, and a control gate electrode formed on said second gate insulating film, said method comprising the steps of:

applying a first voltage between said source region and said control gate so that a first Fowler-Nordheim tunneling current flows through said first gate insulating film to bring each of said memory cells into an over-erased condition in which a center value in distribution of the threshold voltage of each of said memory cells is shifted to an over-erased threshold value beyond said erased threshold value; and applying a second voltage between said substrate region and said control gate so that a second Fowler-Nordheim tunneling current flows through said first gate insulating film in a direction opposite to said first Fowler-Nordheim tunneling current to shift the center value in distribution of the threshold voltage of each of said memory cells to said erased threshold value from said over-erased threshold value.

2. The method as claimed in claim 1, wherein said substrate region is of a p-type, said source and drain regions being of an n-type, said first voltage having a negative value causing electrons to flow from said floating gate to said source region, and said second voltage causing electrons to be injected from said channel region into said floating gate.

3. The method as claimed in claim 1, wherein said second voltage is lower in absolute value than said first voltage.

4. The method as claimed in claim 2, wherein said second voltage is applied in a pulse shape having a voltage of between 12 V and 16 V and a duration between 0.1 sec and 1 sec.

5. The method as claimed in claim 1, wherein said substrate region is made of single-crystal silicon, said floating gate being made of polycrystalline silicon, and said first gate insulating film being a silicon oxide film.

6. The method as claimed in claim 5, wherein said first gate insulating film is 8 to 11 nm in thick.

7. The method as claimed in claim 2, wherein said second voltage is applied with holding said source, drain and substrate regions at a same potential as one another.

8. The method as claimed in claim 2, wherein in synchronism with said second voltage, a third voltage is applied to said well, said third voltage being negative with respect to the potential of said source and drain regions.

9. A method for electrically erasing contents of a set of memory cells to shift threshold voltages thereof to an erased threshold value, each of said memory cells includes a substrate region of a p-type, source and drain regions of an N-type formed in the substrate region, a first gate insulating film formed on a channel region of said substrate region between said source and drain regions, a floating gate formed on said first gate insulating film, a second gate insulating film formed on said floating gate, and a control gate formed on said second gate insulating film, said method comprising the steps of:

applying a negative voltage to said control gate with respect to said source to allow electrons to be released from said floating gate; and applying a positive voltage to said control gate with respect to said substrate region to allow electrons to be returned from said channel region back to said floating gate.

10. The method as claimed in claim 9, wherein the threshold voltage of each of said memory cells is shifted to an over-erased value beyond said erased threshold value by applying said negative voltage and moved to said erased threshold value from said over-erased value by applying said positive voltage.

11. The method as claimed in claim 9, wherein said positive voltage is smaller in absolute value than said negative voltage.

12. The method as claimed in claim 9, wherein said positive voltage is applied in a pulse shape having a voltage of $+12$ V to $+16$ V and a pulse width of 0.01 sec to 1 sec.

13. The method as claimed in claim 9, wherein said positive voltage is applied with said p-well being maintained at a same potential as those of said source and drain regions.

14. The method as claimed in claim 9, in synchronism with said positive voltage, a second negative voltage is applied to said substrate region with respect to said source and drain regions.

15. A method for erasing a plurality of memory cells, each of said memory cells including a substrate region, a source and a drain region, a first insulating film formed on a channel region of said substrate region between said source and drain regions, a floating gate formed on said first insulating film, a second insulating film formed on said floating gate, and a control gate formed on said second insulating film and each of said memory cells storing data therein by retaining carriers into said floating gate and being brought into an erased state by shifting a threshold voltage thereof to an erased threshold value, said method comprising the steps of:

applying a first voltage between said source regions and said control gate to allow said carriers to be released from said floating gate to shift the threshold voltage of each of said memory cell to an over-erased value beyond said erased threshold value; and applying a second voltage between said substrate region and said control gate to inject carriers into said floating gate to shift the threshold voltage of each of said memory cells to said erased threshold value from said over-erased value.

* * * * *